United States Patent
Kurashima et al.

(10) Patent No.: US 12,389,520 B2
(45) Date of Patent: Aug. 12, 2025

(54) PLASMA SOURCE, AND ATOMIC CLOCK EMPLOYING PLASMA SOURCE

(71) Applicant: NATIONAL INSTITUTE OF ADVANCED INDUSTRIAL SCIENCE AND TECHNOLOGY, Tokyo (JP)

(72) Inventors: Yuuichi Kurashima, Tsukuba (JP); Taisei Motomura, Tosu (JP); Shinya Yanagimachi, Tsukuba (JP); Hideki Takagi, Tsukuba (JP); Eiji Higurashi, Tsukuba (JP); Takashi Matsumae, Tsukuba (JP)

(73) Assignee: NATIONAL INSTITUTE OF ADVANCED INDUSTRIAL SCIENCE AND TECHNOLOGY (JP)

( * ) Notice: Subject to any disclaimer, the term of this patent is extended or adjusted under 35 U.S.C. 154(b) by 0 days.

(21) Appl. No.: 18/568,770

(22) PCT Filed: Mar. 24, 2022

(86) PCT No.: PCT/JP2022/013803
§ 371 (c)(1),
(2) Date: Dec. 8, 2023

(87) PCT Pub. No.: WO2022/264603
PCT Pub. Date: Dec. 22, 2022

(65) Prior Publication Data
US 2024/0276626 A1 Aug. 15, 2024

(30) Foreign Application Priority Data
Jun. 14, 2021 (JP) ................................ 2021-098407

(51) Int. Cl.
*H05H 1/10* (2006.01)
*G04F 5/14* (2006.01)
(Continued)

(52) U.S. Cl.
CPC ................ *H05H 1/10* (2013.01); *G04F 5/14* (2013.01); *H01J 41/18* (2013.01); *H03L 7/26* (2013.01); *H05H 1/24* (2013.01)

(58) Field of Classification Search
CPC ... G04F 5/14; H01J 41/18; H03L 7/26; H05H 1/24; H05H 1/10
See application file for complete search history.

(56) References Cited

U.S. PATENT DOCUMENTS

2009/0200158 A1\* 8/2009 Ehiasarian .......... H01J 37/3461
204/192.12
2011/0233397 A1 9/2011 Barofsky et al.
(Continued)

FOREIGN PATENT DOCUMENTS

DE 102011007828 A1 4/2012
JP 63-303065 A 12/1988
(Continued)

OTHER PUBLICATIONS

International Search Report mailed Jun. 14, 2022 in corresponding PCT International Application No. PCT/JP2022/013803.
(Continued)

*Primary Examiner* — Evan P Dzierzynski
*Assistant Examiner* — Nathaniel J Lee
(74) *Attorney, Agent, or Firm* — OSTROLENK FABER LLP

(57) ABSTRACT

A small plasma source that enables highly efficient discharge in an ultra-high vacuum state includes a first magnet, a second magnet arranged so that a second magnetic pole faces the first magnetic pole of the first magnet, a third magnet having the second magnetic pole directed in the same direction as the first magnetic pole of the first magnet and arranged to surround the first magnet, a fourth magnet having the first magnetic pole different from the second
(Continued)

magnetic pole facing the second magnetic pole of the third magnet and arranged to surround the second magnet, a first electrode provided on sides of the first magnetic pole of the first magnet and the second magnetic pole of the third magnet, a second electrode facing the first electrode and provided on sides of the second magnetic pole of the second magnet and the first magnetic pole of the fourth magnet, and a third electrode arranged between the first electrode and the second electrode. A value obtained by dividing a shorter distance between a distance between the first magnet and the second magnet and a distance between the third magnet and the fourth magnet by an average value of thicknesses of the first to fourth magnets is 1 or more and 10 or less.

16 Claims, 10 Drawing Sheets

(51) Int. Cl.
    *H01J 41/18*     (2006.01)
    *H03L 7/26*     (2006.01)
    *H05H 1/24*     (2006.01)

(56) References Cited

U.S. PATENT DOCUMENTS

2014/0262748 A1*   9/2014   Tietema ............. H01J 37/3452
                                                         204/192.3

2016/0005575 A1   1/2016   Duminica et al.
2016/0025587 A1   1/2016   Andreaus et al.
2017/0133210 A1   5/2017   Tanaka

FOREIGN PATENT DOCUMENTS

| JP | H 05092953 U | 12/1993 |
|---|---|---|
| JP | 2006-511921 A | 4/2006 |
| JP | 2008-084859 A | 4/2008 |
| JP | 2011-003425 A | 1/2011 |
| JP | 2016-012501 A | 1/2016 |
| JP | 2016-513787 A | 5/2016 |
| JP | 2020-026559 A | 2/2020 |
| WO | WO 2004/061889 A2 | 7/2004 |

OTHER PUBLICATIONS

T Grzebyk et al., "MEMS ion-sorption high vacuum pump", Journal of Physics: Conference Series 773 (2016) 012047.

T Grzebyk et al., "Magnetron-like miniature ion source", Vacuum 151 (2018) 167-174.

Daschner R. et al., Triple stack glass-to-glass anodic donding for optogalvanic spectroscopy cells with electrical feedthroughs', Applied Physics Letters, American Institute of Physics, 2 Huntington Quadrangle, Melville, NY 11747, vol. 105, No. 4, (Jul. 28, 2014), XP012189251, ISSN: 0003-6951, DOI: 10.1063/1.4891534.

* cited by examiner

PLASMA SOURCE, AND ATOMIC CLOCK EMPLOYING PLASMA SOURCE

CROSS-REFERENCE TO RELATED APPLICATIONS

The present application is a 35 U.S.C. §§ 371 national stage application of International Application No. PCT/JP2022/013803, filed Mar. 24, 2022, which claims priority to Japanese Patent Application No. 2021-098407, filed Jun. 14, 2021, the contents of which are incorporated herein by reference.

TECHNICAL FIELD

The present invention relates to a plasma source and an atomic clock employing the plasma source.

Small cells sealed in an ultra-high vacuum are expected to be applied to a variety of innovative devices. Such a small ultra-high vacuum cell is implemented by hermetically sealing the cell at a medium vacuum ($10^{-1}$ to 1 Pa) and then further evacuating the cell from the outside using an ultra-high vacuum pump. Generally, ion pumps are widely used as ultra-high vacuum pumps and a plasma source capable of performing a highly efficient discharge process is used inside of an ion pump.

As a small micro electro mechanical systems (MEMS) vacuum pump, technology in which a structure similar to that of an ion pump is implemented by a MEMS process (microfabrication and anodic bonding) is known. In this technology, a north pole of a first magnet and a south pole of a second magnet are allowed to face each other, a first cathode electrode of silicon is placed on the first magnet side, a second cathode electrode of silicon is placed on the second magnet side, and an anode electrode of silicon is arranged to provide a gap between the first cathode electrode and the second cathode electrode. With such a small MEMS vacuum pump, it is difficult to perform a highly efficient discharge process in an ultra-high vacuum state of about $10^{-5}$ Pa or less.

Also, other technologies for arranging a cathode electrode on the center, arranging an anode electrode on substantially the same plane as the cathode electrode to surround the cathode electrode on the outside, and arranging magnets above and below the cathode electrode and the anode electrode so that different magnetic poles face each other are known. Thereby, electrons are confined, a discharge process is performed, the electrons are allowed to collide with the residual gas, and the gas is exhausted. In this technology, it is also difficult to perform a highly efficient discharge process in an ultra-high vacuum state of about $10^{-5}$ Pa or less.

On the other hand, a magnetron sputtering method is known as a method of forming a film on a substrate and technology for arranging magnets in the order of north pole, south pole, and north pole on the lower side in the film formation device for this method and arranging magnets in the order of south pole, north pole, and south pole on the upper side to face the magnets on the lower side is present. However, because the purpose of this technology is to form a film on a substrate, this technology cannot be directly applied to the problem of highly efficient discharge in an ultra-high vacuum state.

CITATION LIST

Patent Document

Patent Document 1

Japanese Unexamined Patent Application, First Publication No. 2020-26559

Patent Document 2

Japanese Unexamined Patent Application, First Publication No. S63-303065

Non-Patent Document

Non-Patent Document 1

T. Grzebyk et al., "MEMS ion-sorption high vacuum pump", Journal of Physics: Conference Series 773 (2016) 012047

Non-Patent Document 2

T. Grzebyk et al., "Magnetron-like miniature ion source", Vacuum 151 (2018) 167-174

SUMMARY OF INVENTION

Technical Problem

Accordingly, an objective of the present invention is to provide a small plasma source that enables highly efficient discharge in an ultra-high vacuum state.

Solution to Problem

According to a first aspect of the present embodiment, a plasma source includes (A) a first magnet; (B) a second magnet arranged so that a second magnetic pole different from a first magnetic pole faces the first magnetic pole of the first magnet; (C) a third magnet having the second magnetic pole different from the first magnetic pole directed in the same direction as the first magnetic pole of the first magnet and arranged to surround the first magnet; (D) a fourth magnet having the first magnetic pole different from the second magnetic pole facing the second magnetic pole of the third magnet and arranged to surround the second magnet; (E) a first electrode provided on sides of the first magnetic pole of the first magnet and the second magnetic pole of the third magnet; (F) a second electrode facing the first electrode and provided on sides of the second magnetic pole of the second magnet and the first magnetic pole of the fourth magnet; and (G) a third electrode arranged between the first electrode and the second electrode so that a voltage having a higher potential than those of the first electrode and the second electrode is applied thereto. A maximum magnetic field strength $|By(max)|$ of a first direction from the second magnet to the first magnet in a first space between the first magnet and the second magnet and a second space between the third magnet and the fourth magnet and a minimum magnetic field strength $|By(min)|$ of the first direction satisfy $|By(min)|/|By(max)| \geq 0.1$. A maximum magnetic field strength $|Bx(max)|$ of a second direction orthogonal to the first direction in a third space sandwiched between the first space and the second space and a minimum magnetic field strength |Bx(min)| of the second direction satisfy |Bx(min)|/|Bx(max)|≤0.1.

According to a second aspect of the present embodiment, a plasma source includes (A) a first magnet: (B) a second magnet arranged so that a second magnetic pole different from a first magnetic pole faces the first magnetic pole of the first magnet: (C) a third magnet having the second magnetic pole different from the first magnetic pole directed in the same direction as the first magnetic pole of the first magnet and arranged to surround the first magnet: (D) a fourth magnet having the first magnetic pole different from the second magnetic pole facing the second magnetic pole of the third magnet and arranged to surround the second magnet: (E) a first electrode provided on sides of the first magnetic pole of the first magnet and the second magnetic pole of the third magnet; (F) a second electrode facing the first electrode and provided on sides of the second magnetic pole of the second magnet and the first magnetic pole of the fourth magnet; and (G) a third electrode arranged between the first electrode and the second electrode so that a voltage having a higher potential than those of the first electrode and the second electrode is applied thereto. A value obtained by dividing a shorter distance between a distance between the first magnet and the second magnet and a distance between the third magnet and the fourth magnet by an average value of thicknesses of the first to fourth magnets is greater than or equal to 1 and less than or equal to 10.

DESCRIPTION OF EMBODIMENTS

Embodiment 1

Figure 1:
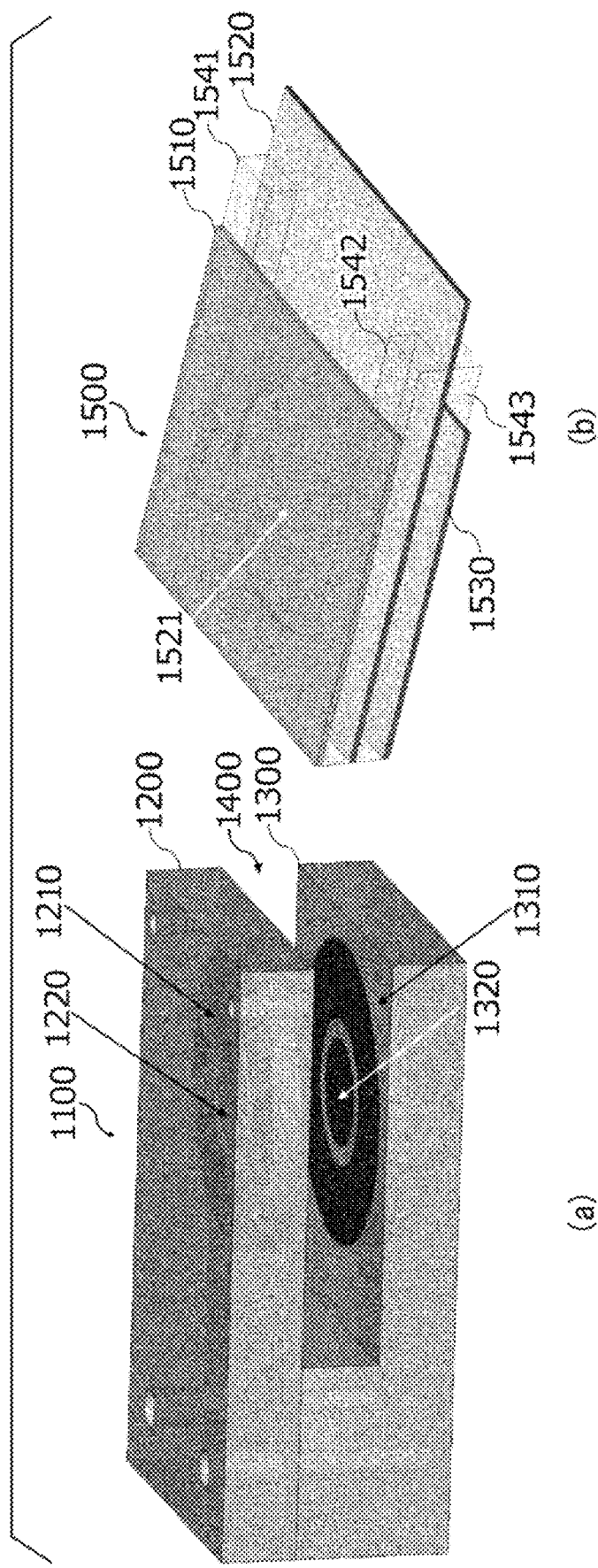
FIG. 1 is a diagram showing an outline of a plasma source according to a first embodiment.

FIG. 1 shows an example of a configuration of a plasma source according to the present embodiment. The plasma source according to the present embodiment is a combination of a yoke 1100 shown in FIG. 1(a) and a cell portion 1500 shown in FIG. 1(b). The yoke 1100 has an upper arm 1200 and a lower arm 1300 and a gap 1400 is provided between the upper arm 1200 and the lower arm 1300. The cell portion 1500 is inserted into this gap 1400. That is, a length of the gap 1400 in the vertical direction is slightly longer than a thickness of the cell portion 1500.

The upper arm 1200 includes a columnar magnet 1220 and a cylindrical magnet 1210 surrounding the columnar magnet 1220. That is, an inner diameter of the cylindrical magnet 1210 is larger than a diameter of the columnar magnet 1220.

Preferably, the center point of the columnar magnet 1220 as seen from the top surface and the center point of the cylindrical magnet 1210 as seen from the top surface are arranged to coincide with each other. Also, preferably, the thickness of the cylindrical magnet 1210 and the thickness of the columnar magnet 1220 are the same and magnets having the same strength are used therefor. Furthermore, preferably, the lower surface of the cylindrical magnet 1210 and the lower surface of the columnar magnet 1220 are arranged to coincide with the lower surface of the upper arm 1200.

The lower arm 1300 includes a columnar magnet 1320 and a cylindrical magnet 1210 surrounding the columnar magnet 1320. That is, the inner diameter of the cylindrical magnet 1310 is larger than the diameter of the columnar magnet 1320. Preferably, the center point of the columnar magnet 1320 as seen from the top surface and the center point of the cylindrical magnet 1310 as seen from the top surface are arranged to coincide with each other. Also, preferably, the thickness of the cylindrical magnet 1310 and the thickness of the columnar magnet 1320 are the same and magnets having the same strength are used therefor. Further, preferably, the upper surface of the cylindrical magnet 1310 and the upper surface of the columnar magnet 1320 are arranged to coincide with the upper surface of the lower arm 1300. Also, the columnar elements that are not labeled with reference signs in FIG. 1(a) are design connection parts that are not relevant to the following description and therefore description thereof will be omitted.

Also, more preferably, the cylindrical magnets 1210 and 1310 and the columnar magnets 1220 and 1320 have the same strength. For example, it is assumed that the magnet is a neodymium or samarium cobalt magnet. Furthermore, preferably, the shapes of the columnar magnet 1220 and the columnar magnet 1320 are the same and the shapes of the cylindrical magnet 1210 and the cylindrical magnet 1310 are also the same. Furthermore, preferably, the center point of the columnar magnet 1220 as seen from the top surface, the center point of the cylindrical magnet 1210 as seen from the top surface, the center point of the columnar magnet 1320 as seen from the top surface, and the center point of the cylindrical magnet 1310 as seen from the top surface are arranged to coincide with each other.

The cell portion 1500 includes a flat upper electrode 1510 made of, for example, silicon, a flat lower electrode 1530 made of, for example, silicon, spacers 1541 to 1543 and the like made of, for example, glass, and a flat electrode 1520 held by the spacers 1541 to 1543 and the like and having a hole 1521 between the upper electrode 1510 and the lower electrode 1530. Also, spacers, for example, the spacer 1541 and the spacer under the electrode 1520, are not shown in FIG. 1 for convenience of illustration. A voltage with a higher potential than the upper electrode 1510 and the lower electrode 1530 is applied to the electrode 1520. For example, the upper electrode 1510 and the lower electrode 1530 are grounded and a positive voltage is applied to the electrode 1520. Preferably, the electrode 1520 is held between the upper electrode 1510 and the lower electrode 1530. Also, preferably, the hole 1521 is circular and its diameter is larger than or equal to the inner diameters of the cylindrical magnets 1210 and 1310. Furthermore, preferably, the center of the hole 1521 and the center points of the columnar magnets 1220 and 1320 as seen from the top surface are allowed to coincide with each other. Here, the shape of the hole 1521 is arbitrary. The hole 1521 is formed to form a space 1700 shown in FIG. 3, so that the lower electrode 1530 is not completely shielded from the upper electrode 1510.

In FIG. 1(*b*), for convenience of illustration, it is shown that there is a space on the left and right sides of the cell portion 1500, but a sealed space can be formed by appropriately adding the spacer or changing the shape.

Figure 2:
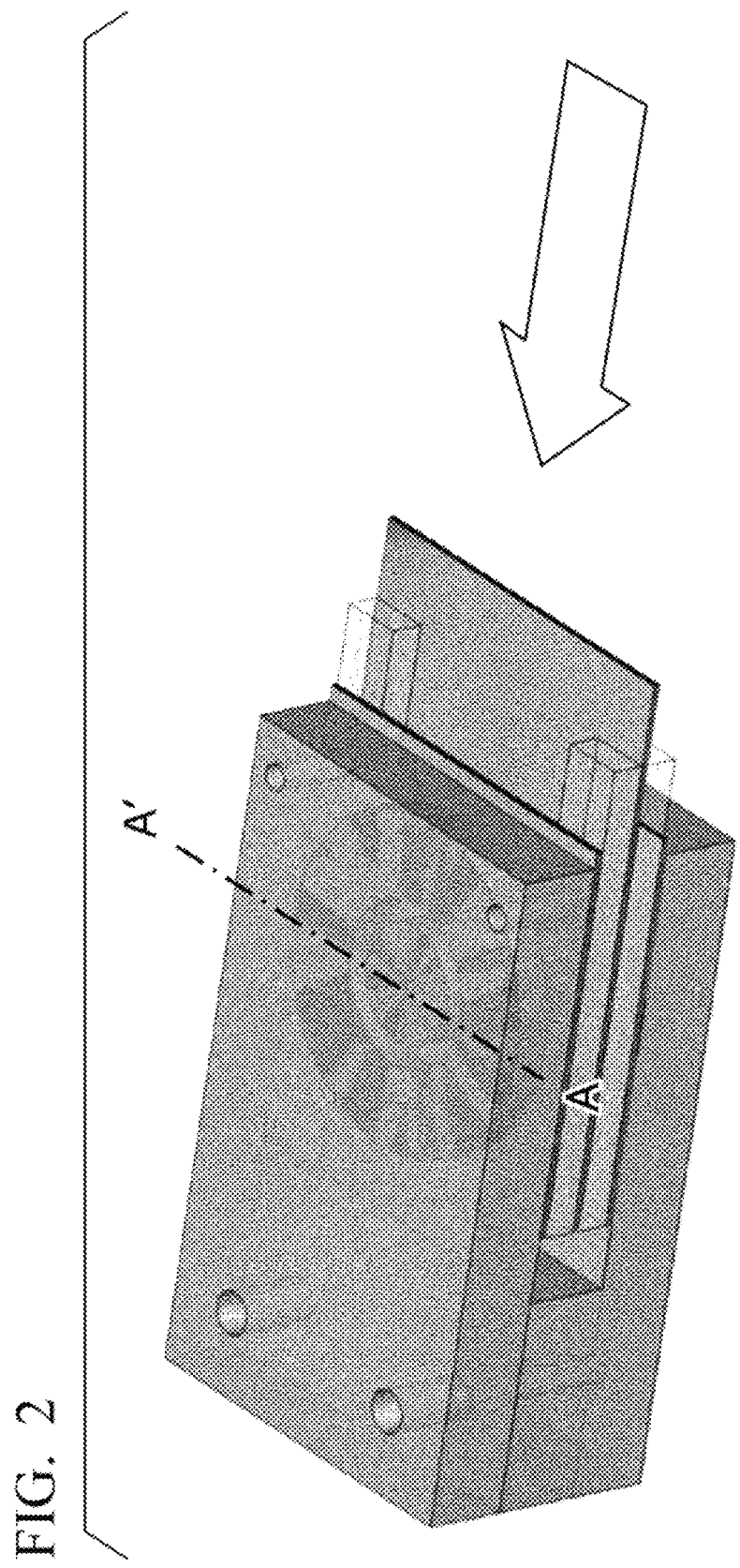
FIG. 2 is a diagram showing an outline of the plasma source according to the first embodiment.

FIG. 2 schematically shows a state in which the yoke 100 and the cell portion 1500 are combined. Hereinafter, in order to describe the detailed configuration, a case where the cross-section is cut along dashed line A-A' and viewed in the direction of the arrow will be described.

Figure 3:
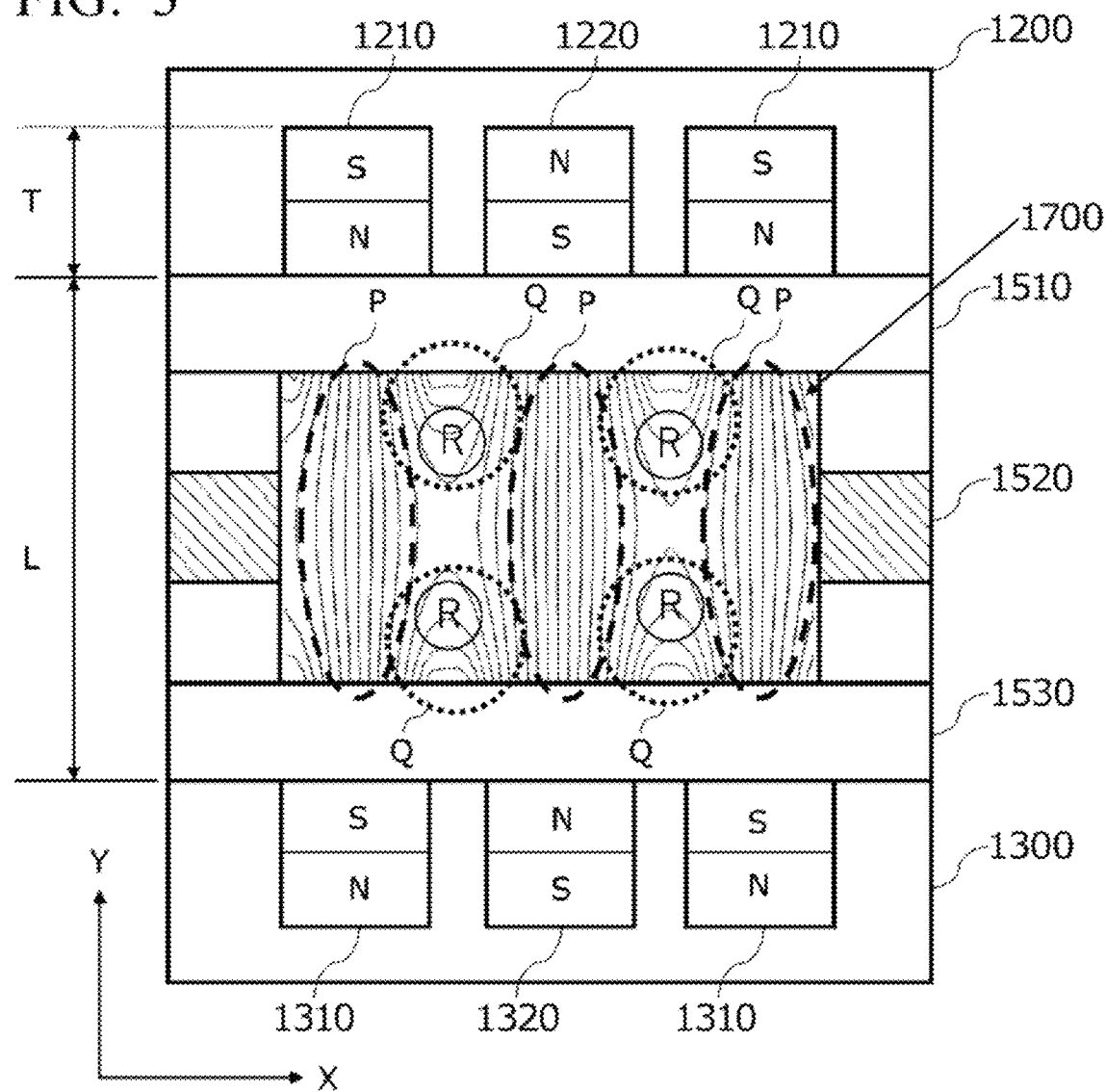
FIG. 3 is a diagram for describing a magnet arrangement and the like in the plasma source according to the first embodiment.

FIG. 3 is a diagram schematically showing the above-described cross-section. In the present embodiment, the columnar magnet 1220 has a south pole directed toward the facing columnar magnet 1320 and the columnar magnet 1320 has a north pole directed toward the facing columnar magnet 1220. The cylindrical magnet 1210 has a north pole directed toward the facing cylindrical magnet 1310 and the cylindrical magnet 1310 has a south pole directed toward the facing cylindrical magnet 1210. Also, the south pole and the north pole may be reversed. By arranging the magnets in this way, magnetic force lines as shown are generated in the space 1700 sandwiched between the upper electrode 1510 and the lower electrode 1530 and further surrounded by the spacers 1541 to 1543 and the like and the electrode 1520. In the present embodiment, a magnetic circuit including the columnar magnets 1220 and 1320 and the cylindrical magnets 1210 and 1310 generates a magnetron magnetic field Q and a parallel magnetic field P of a certain strength or higher to confine plasma at a high density. Here, the direction from the lower arm 1300 to the upper arm 1200 facing the lower arm 1300 is defined as a Y-direction and a direction orthogonal to the Y-direction is defined as an X-direction. Electrons do not move and are bounced back when the magnetic force lines are from sparse to dense (magnetic field strength is from weak to strong). Electrons do not move in the Y-direction due to the magnetron magnetic field Q. Also, because a zero magnetic field region occurs between the upper and lower magnetron magnetic fields Q, electrons do not move across the magnetic force lines from the zero magnetic field region. Furthermore, they do not similarly move due to the parallel magnetic field P in the X-direction as well. Therefore, plasma can be confined in the region R and high-density plasma can be generated.

Also, in FIG. 3, the thickness of the electrode is emphasized for convenience of illustration. As an example, the diameters of the columnar magnets 1220 and 1320 are 7 mm and the outer diameters of the cylindrical magnets 1210 and 1310 are 20 mm, and the inner diameter thereof is 10 mm. Also, the distance between the upper electrode 1510 and the lower electrode 1530 is 4.4 mm. Also, in the present embodiment, a small plasma source is assumed and the distance between the upper electrode 1510 and the lower electrode 1530 is assumed to be about 20 mm at the longest. In order to implement this, the Debye length (plasma size) $\lambda D$ is $\frac{1}{10}$ or less of the above-mentioned distance (1 mm or less because two plasmas are generated above and below). More specifically, the Debye length is 1 mm or less at a vacuum level of $10^{-4}$ Pa. When the Debye length (plasma size) exceeds $\frac{1}{10}$ of the above-described distance, the number of charged particles disappearing after colliding with the wall is larger than the number of charged particles generated from the electrode, and the plasma cannot be maintained.

With only the magnet arrangement shown in FIG. 3, it is not possible to generate high-density plasma as described above. In the present embodiment, a value obtained by dividing a shortest distance between the magnet in the upper arm 1200 and the magnet in the lower arm 1300 facing the magnet by an average thickness of the used magnets is defined as an inter-magnet distance ratio. In the example shown in FIG. 3, the thicknesses of the magnets are all the same T, and the distance between the magnet in the upper arm 1200 and the magnet in the lower arm 1300 facing the magnet is also all the same L. In this case, L/T becomes an inter-magnet distance ratio.

Figure 4:
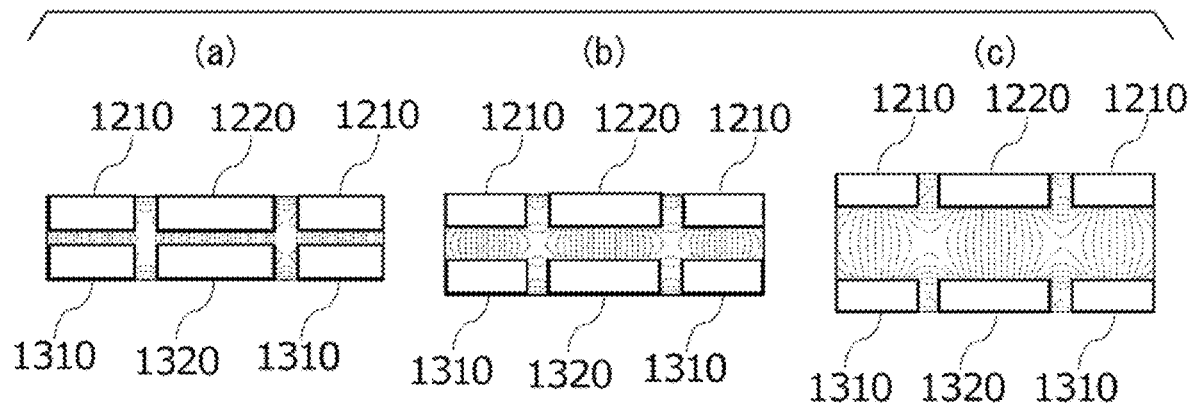
FIGS. 4(a) to 4(c) are diagrams showing examples of magnetic field line distributions for inter-magnet distance ratios.

When the inter-magnet distance ratio L/T is a small value, for example, 0.5, the magnets are excessively close to each other and do not have a sufficiently strong magnetron magnetic field as shown in the simulation result schematically shown in FIG. 4(*a*). When the inter-magnet distance ratio L/T increases to, for example, 1.0, a magnetron magnetic field is generated and high-density plasma can be generated, as shown in the simulation result schematically shown in FIG. 4(*b*). When the inter-magnet distance ratio L/T further increases to, for example, 2.5, a sufficiently strong magnetron magnetic field and parallel magnetic field are generated. Even if the inter-magnet distance ratio L/T further increases to, for example, 5.0, a sufficiently strong magnetron magnetic field and parallel magnetic field are generated, as shown in the simulation result schematically shown in FIG. 5(*a*). When the inter-magnet distance ratio L/T further increases to, for example, 10, the magnetron magnetic field becomes dominant as shown in the simulation results schematically shown in FIG. 5(*b*), but a parallel magnetic field is also formed to some extent. When the inter-magnet distance ratio L/T further increases to, for example, 20, almost no parallel magnetic field is generated and the magnetron magnetic field becomes dominant, as shown in the simulation result schematically shown in FIG. 5(*c*). As a result, plasma confinement becomes impossible.

According to the above simulation results, if the inter-magnet distance ratio L/T is 1 or more and 10 or less, it can be used as a general plasma source. Also, in order to achieve higher-density plasma confinement, the inter-magnet distance ratio L/T is preferably 2.5 or more and 5 or less.

Figure 6:
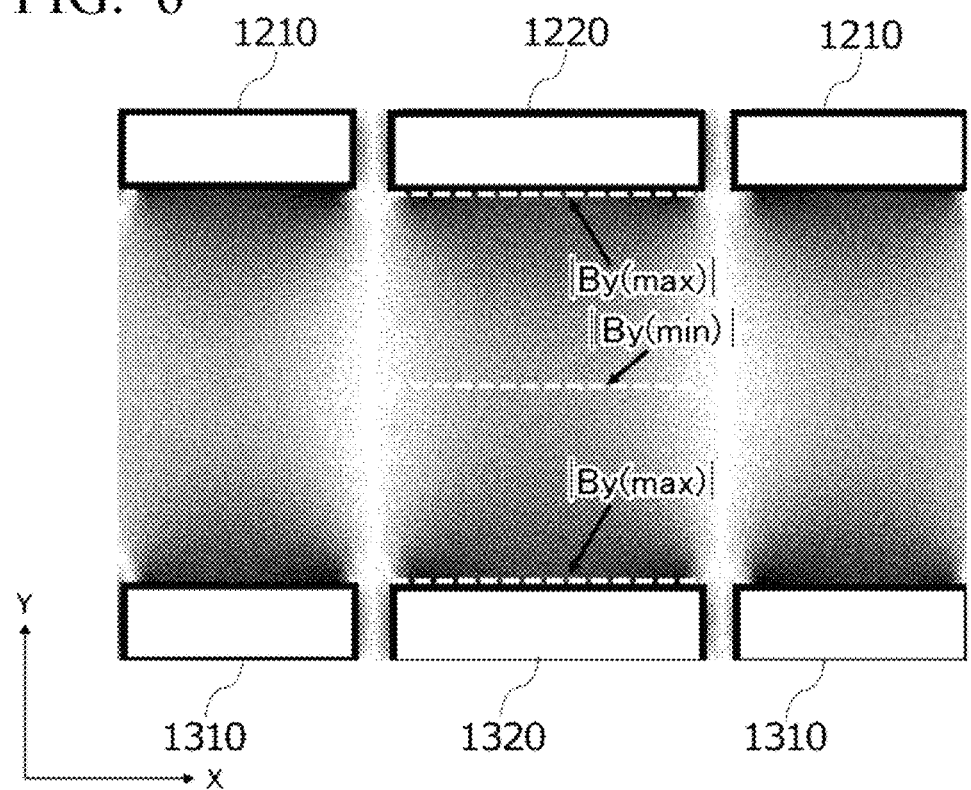
FIG. 6 is a diagram showing an example of a magnetic force strength distribution in a Y-direction.

Also, another indicator of the ability to generate parallel and magnetron magnetic fields of sufficient strength will also be described. Here again, a direction from the magnet of the lower arm 1300 to the magnet of the upper arm 1200 is defined as the Y-direction and a direction perpendicular thereto is defined as the X-direction. A parallel magnetic field is a magnetic field in the Y-direction and a magnetron magnetic field is a magnetic field in the X-direction. At this time, in the space between the magnet pair (the columnar magnets 1220 and 1320 or the cylindrical magnets 1210 and 1310) having the shortest distance between the magnet of the lower arm 1300 and the magnet of the upper arm facing the magnet, the strongest magnetic field strength |By(max)| is searched for. In FIG. 6, the magnetic field strength in the Y-direction in the case of the magnet arrangement as shown in FIG. 3 is schematically shown. Also, when the color is darker, an absolute value of the magnetic field strength is larger. In the present example, the distance between the columnar magnet 1220 and the columnar magnet 1320 is the same as the distance between the cylindrical magnet 1210 and the cylindrical magnet 1310, but the focus here is on the magnet pair of the columnar magnets 1220 and 1320. Then, the strongest magnetic field strength |By(max)| is obtained on the surfaces of the columnar magnets 1220 and 1320 (white thick dotted lines). Also, the weakest magnetic field strength |By(min)| is searched for in the space between the pair of magnets (i.e., the columnar magnets 1220 and 1320) where the strongest magnetic field strength |By(max)| is obtained. In the magnet arrangement as shown in FIG. 3, the weakest magnetic field strength |By(min)| is obtained in a plane passing through a midpoint of a line segment perpendicular to the surface (white dotted line) of the columnar magnets 1220 and 1320 where |By(max)| is obtained and perpendicular to the line segment (center white dotted line). Then, using |By(min)|/|By(max)| as an index value, a preferable parallel magnetic field is generated when |By(min)|/|By(max)|≥0.1. This is a criterion for determining that it is preferable that the magnetic field emitted from the magnet is not disturbed and that all the magnetic flux is directed from the north pole to the south pole. Also, because the index value is 1 when |By(min)|=|By(max)|, 1>|By(min)|/|By(max)|.

Figure 7:
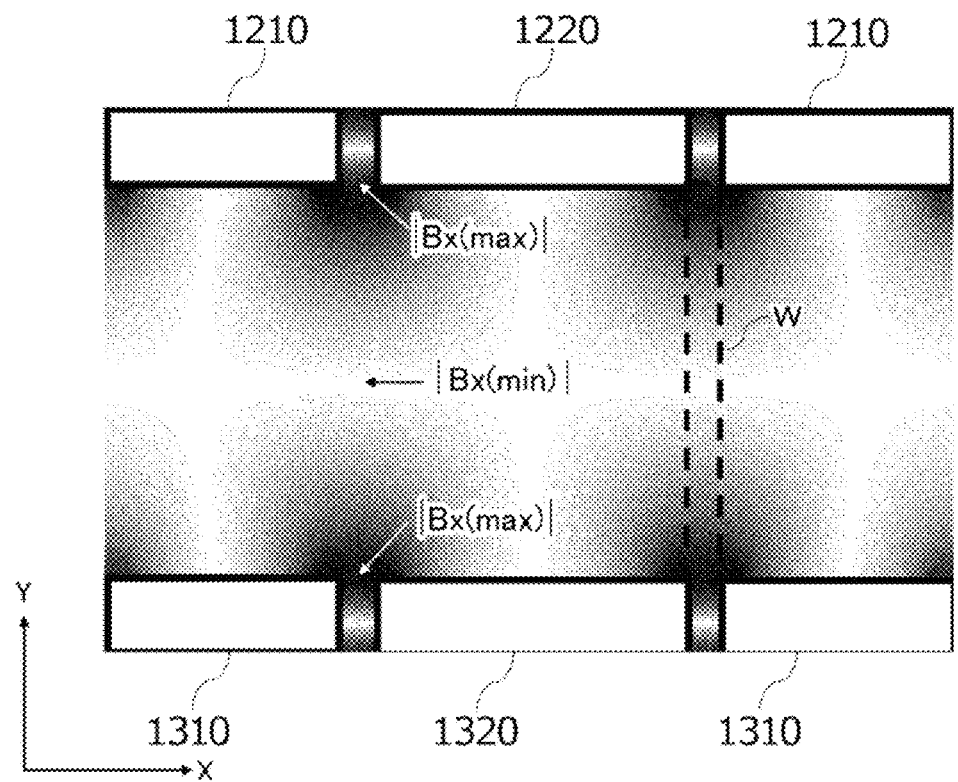
FIG. 7 is a diagram showing an example of a magnetic force strength distribution in an X-direction.

On the other hand, the magnetron magnetic field is a magnetic field in the X-direction, and attention is paid to the magnetic field strength in the X-direction. At this time, in a space W sandwiched between a space between the columnar magnet 1220 and the columnar magnet 1320 and a space between the cylindrical magnet 1210 and the cylindrical magnet 1310, the strongest magnetic field strength |Bx(max)| is searched for. In FIG. 7, the magnetic field strength in the X-direction in the case of the magnet arrangement as shown in FIG. 3 is schematically shown. Here, when the color is darker, the absolute value of the magnetic field strength is larger. In this case, the strongest magnetic field strength |Bx(max)| is obtained at the midpoint of the line segment connecting the ends of the columnar magnet 1220 and the cylindrical magnet 1210 and at the midpoint of the line segment connecting the ends of the columnar magnet 1320 and the cylindrical magnet 1310. Also, in the same space W, the weakest magnetic field strength |Bx(min)| is searched for. With the magnet arrangement as shown in FIG. 3, the weakest magnetic field strength |Bx(min)| is obtained at the midpoint of the line segment connecting the positions where |Bx(max)| is obtained. Also, using |Bx(min)|/|Bx(max)| as an index value, a preferable magnetron magnetic field is generated when |Bx(min)|/|Bx(max)|≤0.1. This indicates that the stronger contrast between the zero magnetic field region and the high-strength magnetic field formed by the magnetron magnetic field is better. Also, because the index value is 0 when |Bx(min)|=0, 0≤|Bx(min)|/|Bx(max)|.

More preferably, |By(min)|/|By(max)|≥0.3 and |Bx(min)|/|Bx(max)|≤0.03.

Figure 5:
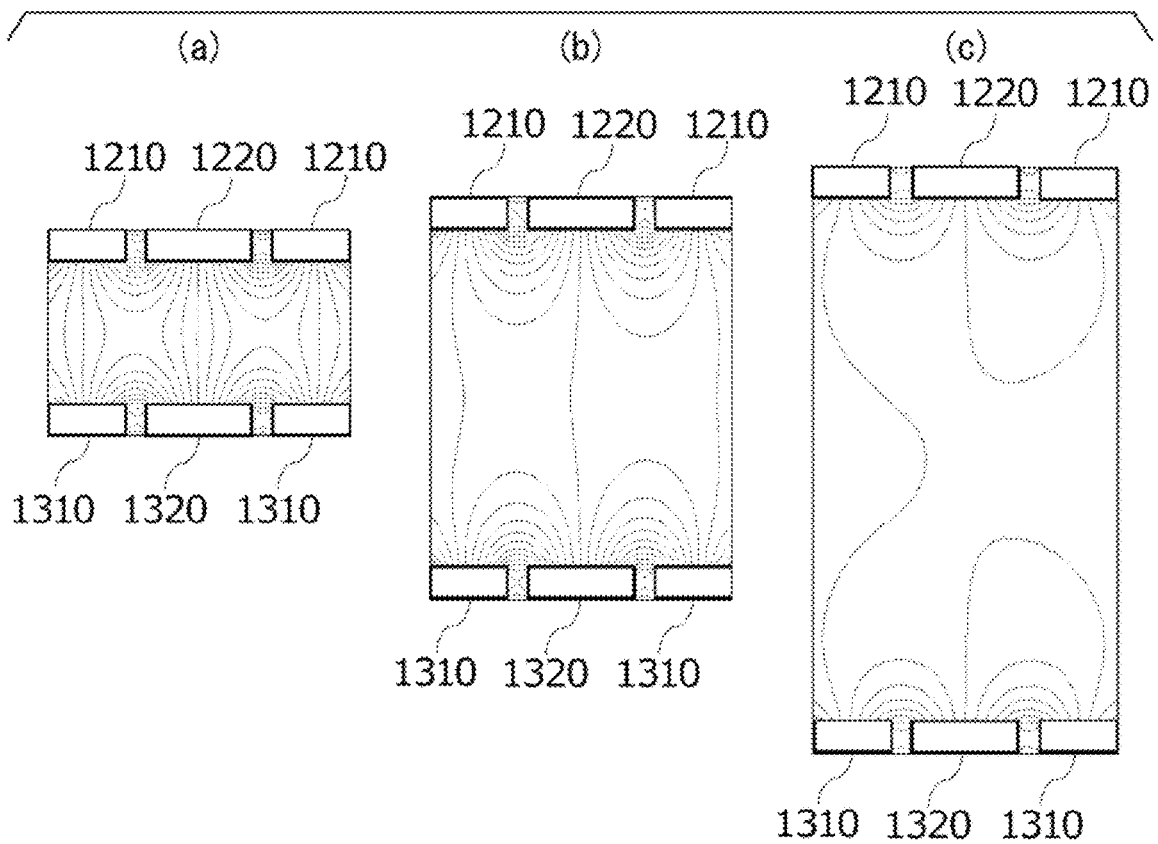
FIGS. 5(a) to 5(c) are diagrams showing examples of magnetic field line distributions for inter-magnet distance ratios.

As described above, high-density plasma confinement becomes possible according to the basic magnet arrangement as shown in FIG. 3, the detailed magnet arrangement described using FIGS. 4 and 5, or the detailed magnetron magnetic field and parallel magnetic field configuration described using FIGS. 6 and 7.

Figure 8:
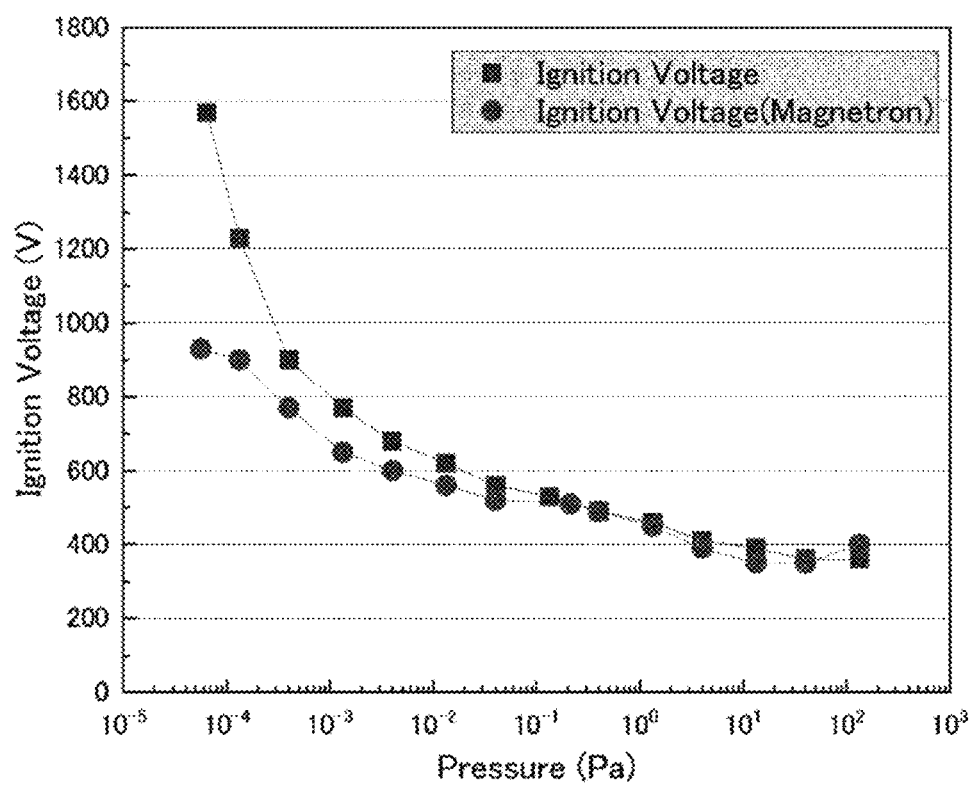
FIG. 8 is a diagram for describing the effect of the plasma source according to the first embodiment.

A relationship between a degree of vacuum and an ignition voltage for the magnet arrangement as shown in FIG. 3 and the magnet arrangement that generates only a parallel magnetic field is shown in FIG. 8. Also, in the case without a magnet, discharge occurred outside the electrodes and did not occur in the space between the electrodes. In FIG. 8, the case where a magnetron magnetic field and a parallel magnetic field are generated is indicated by a circle and the case where only a parallel magnetic field is generated is indicated by a square mark. Up to approximately $10^2$ to $10^{-1}$ Pa, even if a magnetron magnetic field was generated, ignition was performed at approximately the same voltage as in the case of only a parallel magnetic field. However, as can be seen from FIG. 8, it was clearly easier to perform a discharge process by generating a magnetron magnetic field in a high vacuum state of $10^{-1}$ Pa or less because the ignition voltage was low. That is, it can be seen that the plasma generation efficiency is improved in a high vacuum state of $10^{-1}$ Pa or less. The plasma generation efficiency is expected to be improved in an ultra-high vacuum state of $10^{-6}$ Pa or less.

Embodiment 2

Figure 9:
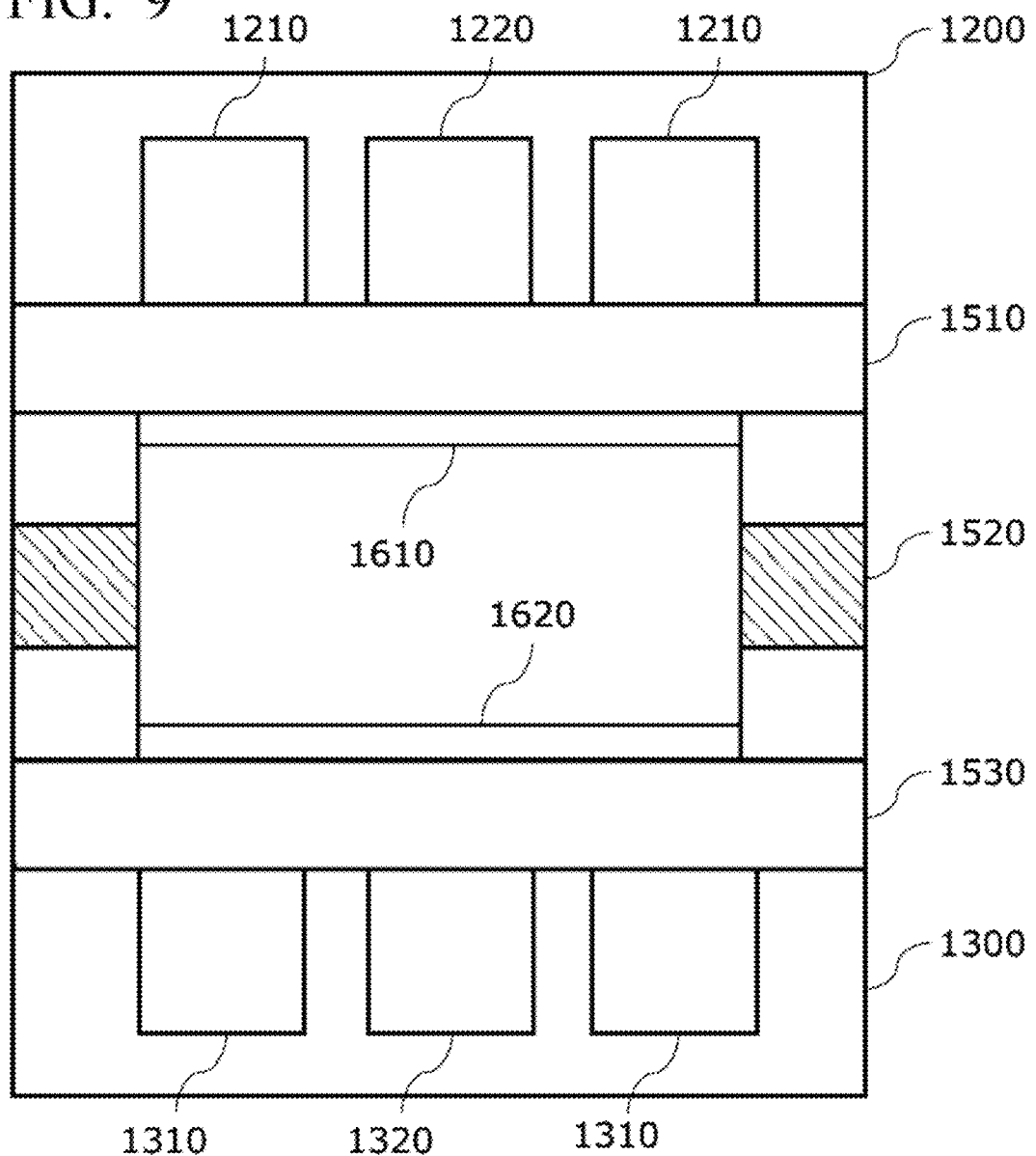
FIG. 9 is a diagram showing an example of a configuration when a plasma source is used as an ion pump.

The plasma source shown in the first embodiment can be applied to an ion pump. When it is used as an ion pump, a Ti film 1610 is formed on the surface of the upper electrode 1510 on the lower arm 1300 side and a Ti film 1620 is formed on the surface of the lower electrode 1530 on the upper arm 1200 side as shown in FIG. 9 in the configuration shown in FIG. 3.

In the ion pump, ions in the plasma head toward the upper electrode 1510 and the lower electrode 1530, which are cathodes, and collide with the Ti atoms of the Ti films 1610 and 1620 formed on the surface, and cause the Ti atoms to scatter in all directions. That is, the Ti atoms are sputtered. The sputtered Ti atoms also form a Ti film on the electrode 1520. Furthermore, the sputtered Ti atoms chemically adsorb active gas and increase the degree of vacuum. Also, even inert gas is ionized by collision with electrons and is confined within the electrodes 1510 and 1530, which are cathodes, and within the Ti films 1610 and 1620. Therefore, the degree of vacuum becomes even higher.

Embodiment 3

Figure 10:
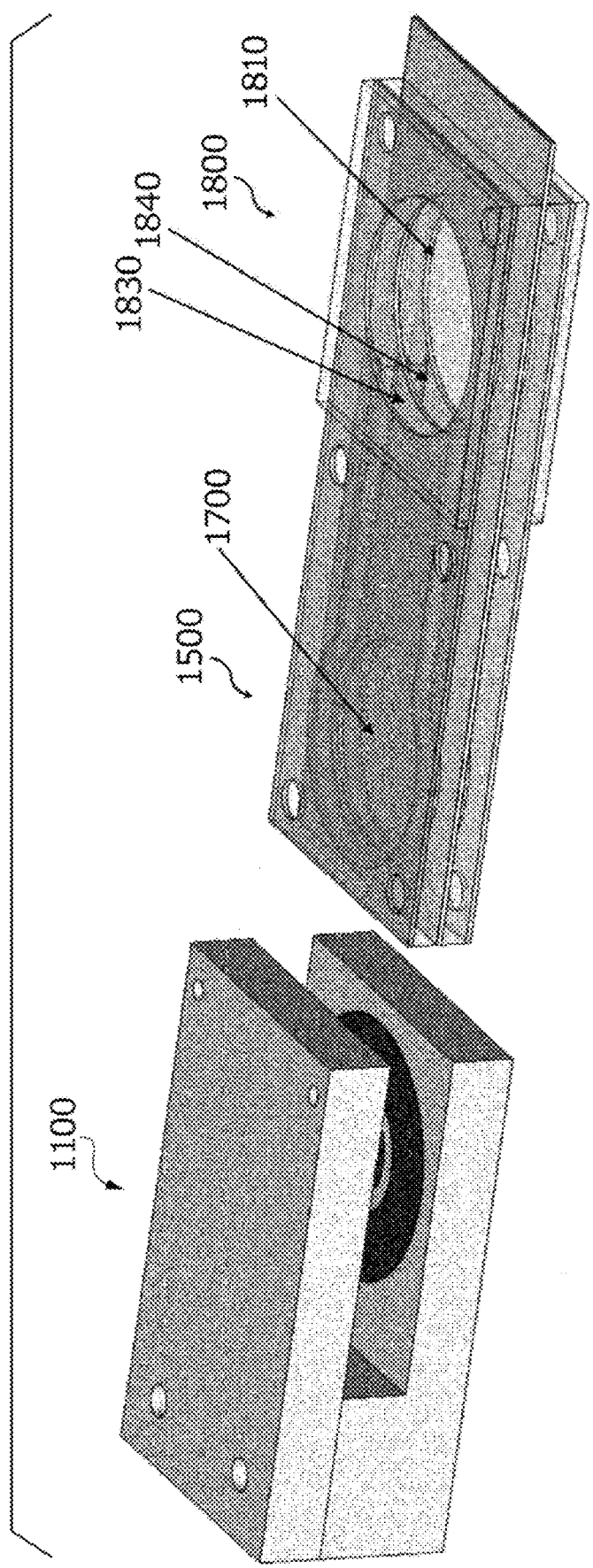
FIG. 10 is a diagram showing an outline of a small cooled atomic clock.

The vacuum pump according to the second embodiment can be applied to a small cooled atomic clock. The configuration of the vacuum pump and the parts related to the vacuum pump in the small cooled atomic clock is schematically shown in FIG. 10. The cell portion 1500 and the atomic clock portion 1800 sandwiched between the upper arm 1200 and the lower arm 1300 of the yoke 1100 are integrated, and the internal space 1700 provided in the cell portion 1500 and the cold atom generation portion 1810 of the atomic clock portion 1800 communicates with a space 1830 between the upper electrode 1510 and the electrode 1520 and a space 1840 between the electrode 1520 and the lower electrode 1530.

Figure 11:
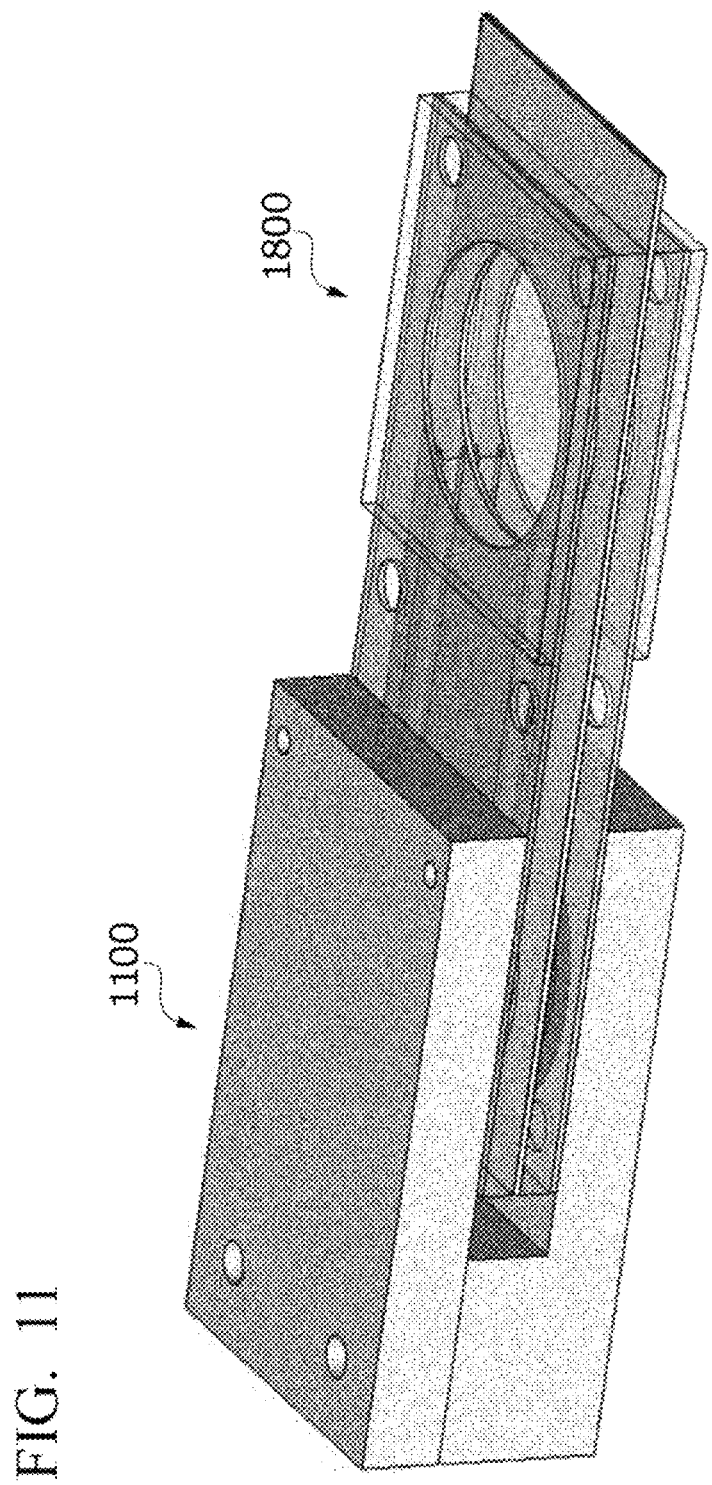
FIG. 11 is a diagram showing an outline of a small cooled atomic clock.

First, as shown in FIG. 11, the cell portion 1500 is inserted between the upper arm 1200 and the lower arm 1300 of the yoke 1100, and a voltage is applied between the upper electrode 1510 and the lower electrode 1530, and the electrode 1520, so that plasma is generated in the space 1700 of the cell portion 1500 and the space 1700 and the cold atom generation portion 1810 are vacuum-evacuated. However, because cold atom generation is adversely affected by the magnetic field, the cell portion 1500 and the atomic clock portion 1800 are separated from the yoke 1100, as shown in FIG. 10. In this way, by configuring the yoke 1100 including the magnet, the cell portion 1500, and the atomic clock portion 1800 to be detachable, it becomes possible to appropriately operate the small cooled atomic clock.

There is a demand for such a small cooled atomic clock as an essential infrastructure for all activities in modern society not only for high-precision positioning of moving objects such as automobiles, for fifth- and sixth-generation mobile communication base stations, but also for reference time in network communications such as mobile, cloud, and electronic commerce and for precision measurement in industrial applications or advanced science and technology (earth exploration and gravitational wave measurement) and the like. Here, the plasma source according to the embodiment can be used as an ion generation source, a light source, and the like for an ion beam.

Although the embodiments of the present invention have been described above, the present invention is not limited thereto. In other words, numerical values other than those related to index values such as the inter-magnet distance ratio L/T, $|By(min)|/|By(max)|$, and $|Bx(min)|/|Bx(max)|$ may be changed to implement numerical values related to index values such as the inter-magnet distance ratio L/T, $|By(min)|/|By(max)|$, and $|Bx(min)|/|Bx(max)|$. Also, regarding the cylindrical magnets 1210 and 1310, a plurality of magnets may be combined to form a cylindrical shape. Also, the columnar magnets 1220 and 1320 and the cylindrical magnets 1210 and 1310 may have shapes other than circles.

Furthermore, although many examples in which the distance between the cylindrical magnets 1210 and 1310 is the same as the distance between the columnar magnet 1220 and the columnar magnet 1320 have been shown, they may be different. Also, although FIG. 3 and the like show examples in which the plasma sources are axially symmetrical, they do not necessarily have to be axially symmetrical.

[Regarding Example as Small Vacuum Pump]

Figure 12:
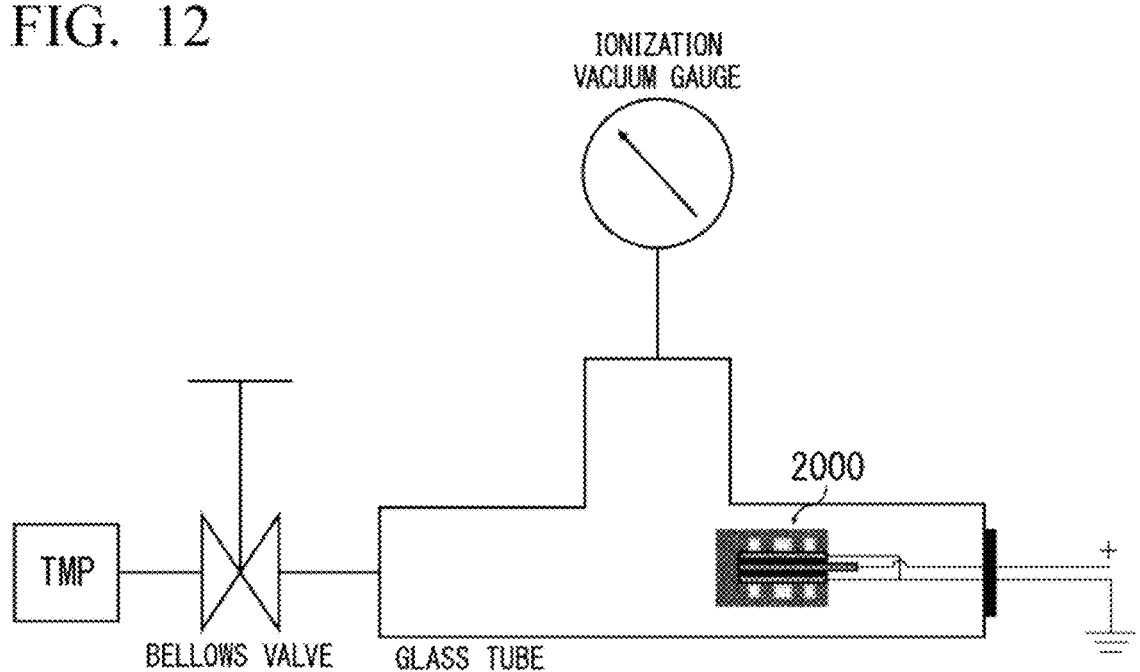
FIG. 12 is a diagram showing an embodiment example when a plasma source is used as a vacuum pump.

A diagram showing the experimental method is shown in FIG. 12. As shown in FIG. 12, a vacuum pump 2000 according to the second embodiment was placed in a glass tube with a volume of 280 cm$^3$ and a voltage could be applied from outside the glass tube in a state in which the tube was hermetically sealed with a feed-through electrode. A turbo molecular pump (TMP) attached to the glass tube was used to vacuum-evacuate the tube, and an ionization vacuum gauge was used to monitor the degree of vacuum inside the glass tube.

After the glass tube was vacuum-evacuated to $1\times10^{-6}$ Pa using a turbo molecular pump, a bellows valve was closed to seal the glass tube. The degree of vacuum deteriorates immediately after the valve is closed due to degassing adsorbed on the O-ring and the inner wall of the glass tube when sealed. The increase in pressure was evaluated at $3\times10^{-3}$ Pa/min. When the valve was closed and the degree of vacuum deteriorated to $1\times10^{-2}$ Pa, a voltage of 1.2 kV was applied to the cathode and anode of the vacuum pump 2000, and a discharge process was attempted for 6 minutes. Thereafter, each of the voltages of 1.5 kV and 1.8 kV was applied for 6 minutes to attempt the discharge process.

Figure 13:
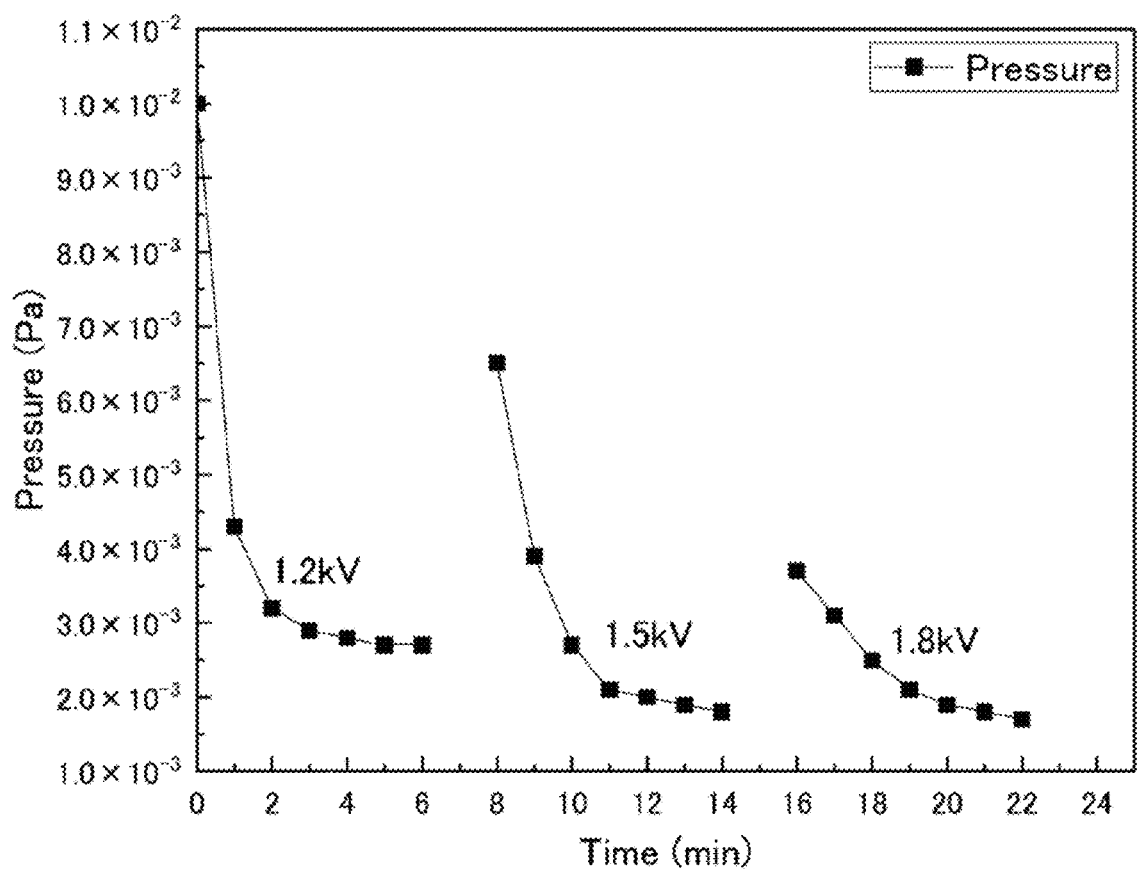
FIG. 13 is a diagram showing an effect when a plasma source is used as a vacuum pump.

As a result, as shown in FIG. 13, while the pressure before voltage application was $1\times10^{-2}$ Pa, the pressure was reduced to $2.7\times10^{-3}$ Pa by applying a voltage of 1.2 kV to the vacuum pump 2000 and performing a discharge process for 6 minutes, the pressure was reduced to $1.8\times10^{-3}$ Pa by applying a voltage of 1.5 kV thereto and performing a discharge process for 6 minutes, and the pressure was finally reduced to $1.7\times10^{-3}$ Pa by applying a voltage of 1.8 kV thereto and performing a discharge process for 6 minutes.

Thereby, it can be said that vacuum evacuation is possible using the plasma source according to the first embodiment.

The present embodiment is summarized as follows.

According to a first aspect of the present embodiment, a plasma source includes (A) a first magnet: (B) a second magnet arranged so that a second magnetic pole different from a first magnetic pole faces the first magnetic pole of the first magnet: (C) a third magnet having the second magnetic pole different from the first magnetic pole directed in the same direction as the first magnetic pole of the first magnet and arranged to surround the first magnet: (D) a fourth magnet having the first magnetic pole different from the second magnetic pole facing the second magnetic pole of the third magnet and arranged to surround the second magnet: (E) a first electrode provided on sides of the first magnetic pole of the first magnet and the second magnetic pole of the third magnet: (F) a second electrode facing the first electrode and provided on sides of the second magnetic pole of the second magnet and the first magnetic pole of the fourth magnet; and (G) a third electrode arranged between the first electrode and the second electrode so that a voltage having a higher potential than those of the first electrode and the second electrode is applied thereto. A maximum magnetic field strength $|By(max)|$ of a first direction from the second magnet to the first magnet in a first space between the first magnet and the second magnet and a second space between the third magnet and the fourth magnet and a minimum magnetic field strength $|By(min)|$ of the first direction satisfy $|By(min)|/|By(max)|\geq 0.1$. A maximum magnetic field strength $|Bx(max)|$ of a second direction orthogonal to the first direction in a third space sandwiched between the first space and the second space and a minimum magnetic field strength $|Bx(min)|$ of the second direction satisfy $|Bx(min)|/|Bx(max)|\leq 0.1$.

By arranging the first to fourth magnets to have such a magnetic field strength distribution, it becomes possible to obtain a small plasma source that enables highly efficient discharge in an ultra-high vacuum state. More preferably, $|By(min)|/|By(max)|\geq 0.3$ and $|Bx(min)|/|Bx(max)|\leq 0.03$.

The plasma source according to the second aspect of the present embodiment has components similar to (A) to (G) in the plasma source according to the first aspect. Also, a value obtained by dividing a shorter distance between a distance between the first magnet and the second magnet and a distance between the third magnet and the fourth magnet by an average value of thicknesses of the first to fourth magnets is 1 or more and 10 or less.

By adopting such a magnet size and magnet arrangement, it becomes possible to obtain a small plasma source that enables highly efficient discharge in an ultra-high vacuum state.

Also, the first magnet and the second magnet described above may be columnar and the third magnet and the fourth magnet may be cylindrical. Axial symmetry is preferable from the viewpoint of efficiency.

Also, in the plasma source according to the second aspect, the value obtained by dividing the shorter distance between the distance between the first magnet and the second magnet and the distance between the third magnet and the fourth magnet by the average value of the thicknesses of the first to fourth magnets is 2.5 or more and 5 or less. Higher density plasma confinement becomes possible.

Furthermore, the first to fourth magnets described above may be detachable from the cells including the first to third electrodes. In this way, after using the plasma source as, for example, an ion pump, when the magnetic force of the magnet has an adverse effect, it becomes possible to remove the first to fourth magnets and use the cell.

The atomic clock according to the present embodiment includes a plasma source in which the first to fourth magnets are detachable from a cell including the first to third electrodes and a cold atom generation portion communicating with the cell of the plasma source. In this way, an ultra-high vacuum state can be obtained by evacuating the cold atom generation portion using an ion pump using a plasma source. Also, during cold atom generation, the first to fourth magnets can be separated from the cell.

The invention claimed is:

1. A plasma source comprising:
   a first magnet;
   a second magnet arranged so that a second magnetic pole different from a first magnetic pole faces the first magnetic pole of the first magnet;
   a third magnet having the second magnetic pole different from the first magnetic pole directed in the same direction as the first magnetic pole of the first magnet and arranged to surround the first magnet;
   a fourth magnet having the first magnetic pole different from the second magnetic pole facing the second magnetic pole of the third magnet and arranged to surround the second magnet;
   a first electrode provided on sides of the first magnetic pole of the first magnet and the second magnetic pole of the third magnet;
   a second electrode facing the first electrode and provided on sides of the second magnetic pole of the second magnet and the first magnetic pole of the fourth magnet; and
   a third electrode arranged between the first electrode and the second electrode so that a voltage having a higher potential than those of the first electrode and the second electrode is applied thereto,
   wherein a maximum magnetic field strength $|By(max)|$ of a first direction from the second magnet to the first magnet in a first space between the first magnet and the second magnet and a second space between the third magnet and the fourth magnet and a minimum magnetic field strength $|By(min)|$ of the first direction satisfy $|By(min)|/|By(max)|≥0.1$, and
   wherein a maximum magnetic field strength $|Bx(max)|$ of a second direction orthogonal to the first direction in a third space sandwiched between the first space and the second space and a minimum magnetic field strength $|Bx(min)|$ of the second direction satisfy $|Bx(min)/|Bx(max)| ≤0.1$.

2. The plasma source according to claim 1,
   wherein the first magnet and the second magnet are columnar, and
   wherein the third magnet and the fourth magnet are cylindrical.

3. The plasma source according to claim 2, wherein the first to fourth magnets are detachable from a cell including the first to third electrodes.

4. An atomic clock comprising:
   the plasma source according to claim 3; and
   a cold atom generation portion communicating with the cell of the plasma source.

5. The plasma source according to claim 1,
   wherein the maximum magnetic field strength $|By(max)|$ of the first direction from the second magnet to the first magnet and the minimum magnetic field strength $|By(min)|$ of the first direction satisfy $|By(min)|/|By(max)|≥0.3$, and
   wherein the maximum magnetic field strength $|Bx(max)|$ of the second direction orthogonal to the first direction and the minimum magnetic field strength $|Bx(min)|$ of the second direction satisfy $|Bx(min)|/|Bx(max)|≤0.03$.

6. The plasma source according to claim 5, wherein the first to fourth magnets are detachable from a cell including the first to third electrodes.

7. An atomic clock comprising:
   the plasma source according to claim 6; and
   a cold atom generation portion communicating with the cell of the plasma source.

8. The plasma source according to claim 1, wherein the first to fourth magnets are detachable from a cell including the first to third electrodes.

9. An atomic clock comprising:
   the plasma source according to claim 6; and
   a cold atom generation portion communicating with the cell of the plasma source.

10. A plasma source comprising:
    a first magnet;
    a second magnet arranged so that a second magnetic pole different from a first magnetic pole faces the first magnetic pole of the first magnet;
    a third magnet having the second magnetic pole different from the first magnetic pole directed in the same direction as the first magnetic pole of the first magnet and arranged to surround the first magnet;
    a fourth magnet having the first magnetic pole different from the second magnetic pole facing the second magnetic pole of the third magnet and arranged to surround the second magnet;
    a first electrode provided on sides of the first magnetic pole of the first magnet and the second magnetic pole of the third magnet;
    a second electrode facing the first electrode and provided on sides of the second magnetic pole of the second magnet and the first magnetic pole of the fourth magnet; and
    a third electrode arranged between the first electrode and the second electrode so that a voltage having a higher potential than those of the first electrode and the second electrode is applied thereto,
    wherein a value obtained by dividing a shorter distance between a distance between the first magnet and the second magnet and a distance between the third magnet and the fourth magnet by an average value of thicknesses of the first to fourth magnets is 1 or more and 10 or less.

11. The plasma source according to claim 10, wherein the value obtained by dividing the shorter distance between the distance between the first magnet and the second magnet and the distance between the third magnet and the fourth magnet by the average value of the thicknesses of the first to fourth magnets is 2.5 or more and 5 or less.

12. The plasma source according to claim 11, wherein the first to fourth magnets are detachable from a cell including the first to third electrodes.

13. An atomic clock comprising:
    the plasma source according to claim 12; and
    a cold atom generation portion communicating with the cell of the plasma source.

14. The plasma source according to claim 10,
    wherein the first magnet and the second magnet are columnar, and
    wherein the third magnet and the fourth magnet are cylindrical.

15. The plasma source according to claim 10, wherein the first to fourth magnets are detachable from a cell including the first to third electrodes.

16. An atomic clock comprising:
   the plasma source according to claim 9; and
   a cold atom generation portion communicating with the cell of the plasma source.

* * * * *